United States Patent [19]

Hoshino

[11] Patent Number: 5,343,439
[45] Date of Patent: Aug. 30, 1994

[54] MEMORY APPARATUS
[75] Inventor: Yasuharu Hoshino, Tokyo, Japan
[73] Assignee: NEC Corporation, Tokyo, Japan
[21] Appl. No.: 779,087
[22] Filed: Oct. 18, 1991
[30] Foreign Application Priority Data Oct. 19, 1990 [JP] Japan .................................. 2-282826

[51] Int. Cl.$^5$ .............................................. G11C 7/00
[52] U.S. Cl. ................................... 365/240; 365/236;
365/219; 365/189.12; 365/189.07; 365/221
[58] Field of Search ............... 365/240, 236, 219, 238,
365/189.12, 189.07, 230.05, 230.09, 177, 189.01,
218, 189.05, 221

[56] References Cited
U.S. PATENT DOCUMENTS

| | | | |
|---|---|---|---|
| 4,330,852 | 5/1982 | Redwine et al. | 365/221 |
| 4,987,559 | 1/1991 | Miyauchi et al. | 365/240 |
| 4,989,181 | 1/1991 | Harada | 365/240 |
| 5,084,839 | 1/1992 | Young | 365/189.12 |
| 5,195,055 | 3/1993 | Mizuoka et al. | 365/221 |

Primary Examiner—Eugene R. LaRoche
Assistant Examiner—Andrew Tran
Attorney, Agent, or Firm—Sughrue, Mion, Zinn, Macpeak & Seas

[57] ABSTRACT

A memory apparatus includes a memory cell array for storing a data, a shift register for receiving an input serial data to be stored in the memory cell array and supplying an output serial data to be read from the memory cell array, and a transfer gate for transferring a data in parallel between the shift register and the memory cell array. In the shift register, the input serial data is shifted to an output side thereof until the first bit reaches to the final step thereof. Then, the input serial data is transferred to be stored in the memory cell array by the transfer gate. Thus, when the stored data is read therefrom, no invalid bit is supplied even at the beginning time even if the shift register is longer than the input serial data.

4 Claims, 8 Drawing Sheets

MEMORY APPARATUS

FIELD OF THE INVENTION

This invention relates to a memory apparatus, and more particularly to, a memory apparatus including a shift register for input and output of a serial data for an image field, etc.

BACKGROUND OF THE INVENTION

A first conventional memory apparatus includes a memory cell array for storing data, a data register composed of a plurality of latch circuits, a transfer gate connected between the memory cell array and the data register, and a selector which is a shift register and is connected to the data register.

In the first conventional memory apparatus, when an input serial data is supplied to the selector, the serial data is shifted by the number of bits, so that selection signals are supplied to corresponding latch circuits. The serial data is thereby latched. Then, the serial data is transferred to the memory cell array in parallel by the transfer gate, and is stored in the memory cell array. On the other hand, when the serial data is transferred to the data register in parallel by the transfer gate, the serial data is latched therein by the corresponding latch circuits. Then, the latched serial data is transferred to the shift register for the selector, in which the serial data is shifted to be supplied to a following state.

According to the first conventional memory apparatus, however, there is a disadvantage in that the structure is complicated because the shift register for the selector and the latch circuits for the data register require a number of elements to be used therein. Therefore, a cost of the memory apparatus is high.

A second conventional memory apparatus which overcomes the above disadvantage of the first conventional memory apparatus includes a memory cell array, a data register which is a shift register including a plurality of flip-flop circuits, and a transfer gate connected between the memory cell array and the data register.

The second conventional memory apparatus has been proposed in Japanese Patent Application No. 63-196708. In the second conventional memory device, when an input serial data is supplied to the data register bit by bit, the serial data is shifted therein in accordance with the clock signal. After that, when a last data bit of the serial data is stored in the data register, the serial data is transferred to the memory cell array in parallel by the transfer gate. On the other hand, when the stored data is transferred to the data register in parallel by the transfer gate, the transferred data is shifted therein to an output side of the register, so that the serial data is supplied to a following stage.

According to the second conventional device, however, there is a disadvantage in that, if the number of data bits composing a serial data is smaller than the total shifting steps, each being a flip-flop circuit of the shift register, invalid data bits of the number equal to the difference between those of the serial data bits and the shifting steps are supplied from the data register at the beginning time when the serial data is read out, as explained in detail later.

SUMMARY OF THE INVENTION

Accordingly, it is an object of the invention to provide a memory apparatus in which an effective data bit is supplied even from the initial time when a serial data is read out.

According to the invention, a memory apparatus includes:

a memory cell array for storing a data of bits;

a shift register for receiving an input serial data to be stored in the memory cell array and supplying an output serial data to be read from the memory cell array;

a transfer gate which is positioned between the memory cell array and the shift register to transfer the data of bits in parallel therebetween; and a control circuit for controlling the shift register to shift the input serial data;

wherein the control circuit controls the shift register to shift the input serial data until a first bit thereof reaches to a final step of the shift register, and then controls the transfer gate to transfer the input serial data in parallel to be stored in the memory cell array.

BRIEF DESCRIPTION OF THE DRAWINGS

The invention will be explained in more detail in conjunction with appended drawings; wherein.

DESCRIPTION OF THE PREFERRED EMBODIMENTS

Before describing a memory apparatus according to the invention, the aforementioned conventional memory apparatuses will be explained in conjunction with FIGS. 1 to 3.

Figure 1:
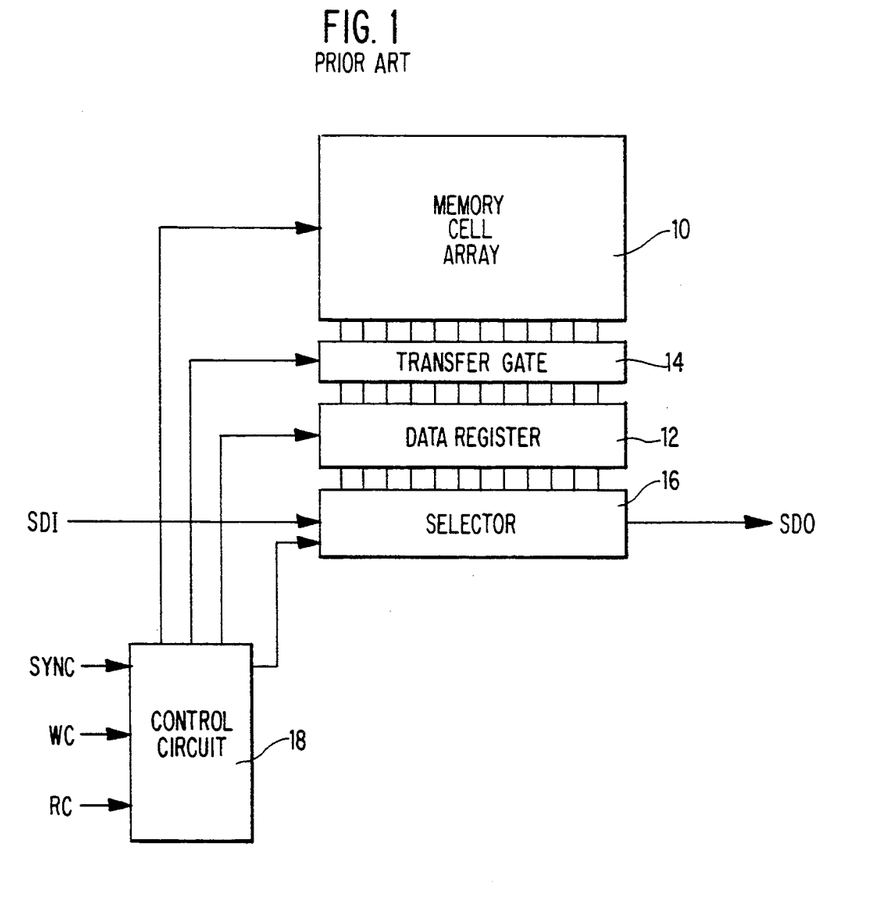
FIG. 1 is a block diagram showing a first conventional memory apparatus.
Figure 2:
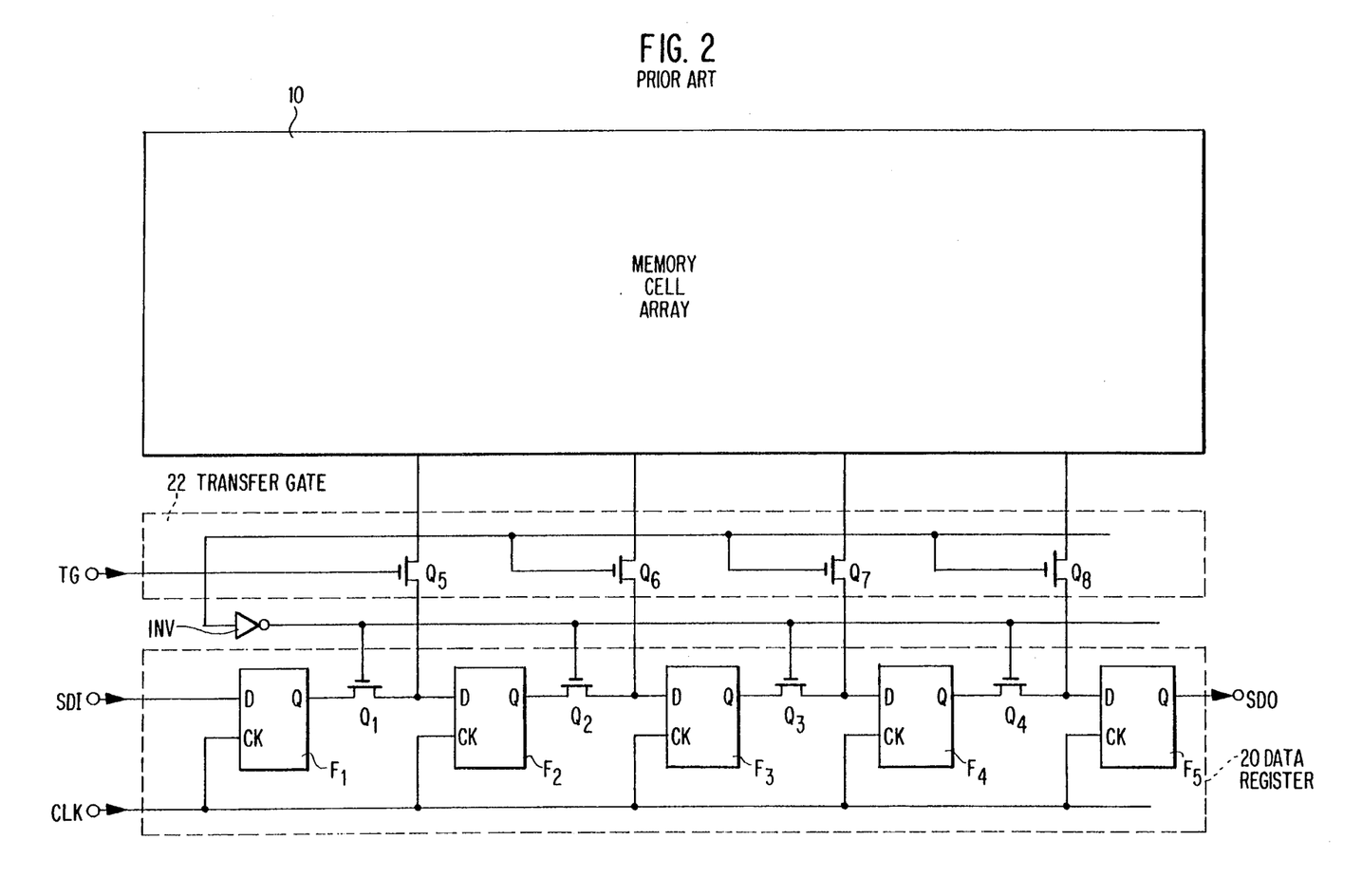
FIG. 2 is a block diagram showing a second conventional memory apparatus.

The first conventional memory apparatus shown in FIG. 1 includes a memory cell array 10 for storing data, a data register 12 composed of a plurality of latch circuits, a transfer gate 14 connected between the memory cell array 10 and the data register 12, a selector 16 which is a shift register and is connected to the data register 12, and a control circuit 18 for controlling the memory cell array 10, the data register 12, the transfer gate 14 and the selector 16, respectively. The selector 16 is supplied with an input serial data SDI and supplies an output serial data SDO to a following stage. The control circuit 18 is supplied with a synchronous signal SYNC, a control signal WC for writing a serial data into the memory cell array 10 and a control signal RC for reading a serial data out of the memory cell array 10.

In the first conventional memory apparatus, when the control signal WC is supplied to the control circuit 18, the input serial data SDI supplied to the selector 16 is shifted therein by a clock signal. The serial data is then transferred to the data register 12, and is stored in corresponding latch circuit selected by the selector 16. After that, the serial data is transferred to the memory cell array 10 in parallel by the transfer gate 14, and is stored in the memory cell array 10.

On the other hand, when the control signal RC is supplied to the control circuit 18, the stored data is transferred to the data register 12 in parallel by the transfer gate 14. Then, the transferred data is supplied to the selector 16, in which the data is shifted therein to be provided therefrom as a serial data to the following stage.

According to the first conventional memory apparatus, however, there is a disadvantage in that a cost of the memory apparatus is high, as described before.

Next, the second conventional memory apparatus overcoming the above disadvantage of the first conventional memory apparatus will be explained in conjunction with FIG. 2. The second conventional memory apparatus includes a memory cell array 10 for storing a data, a data register 20 which is a shift register, and a transfer gate 22 including transistors $Q_5$ to $Q_8$. The data register 20 includes flip-flops $F_1$ to $F_5$ connected in serial and transistors $Q_1$ to $Q_4$. The data register 20 is supplied with an input serial data SDI under the control of a clock signal CLK, and supplies an output serial data SDO to a following stage. The transfer gate 22 is supplied with a control signal TG to transfer a serial data between the memory cell array 10 and the data register 20. The control signal TG is applied through an inverter INV to gates of the transistors $Q_1$ to $Q_4$, and directly to gates of the transistors $Q_5$ to $Q_8$.

Next, operation of the second conventional memory apparatus will be explained in conjunction with FIGS. 3A to 3C. At first, when the input serial data SDI is supplied to the data register 20 in the order of a first bit $B_F$ to a last bit $B_L$ and is shifted in accordance with the clock signal CLK as shown in FIG. 3A. After that, when the last bit $B_L$ is stored in the data register 20, the serial data is transferred to the memory cell array 10 in parallel by the transfer gate 22 as shown in FIG. 3B by an arrow W.

Figure 3A:
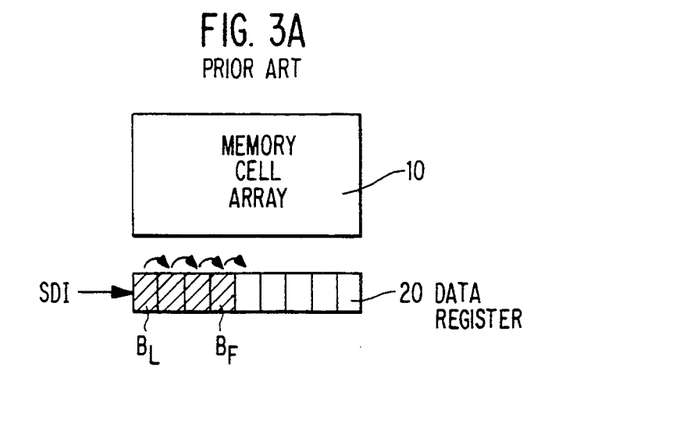
FIGS. 3A to 3C are diagrams explaining operation of the second conventional memory apparatus.
Figure 3B:
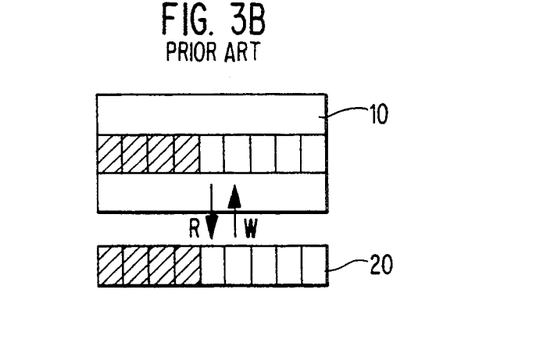

On the other hand, when the stored data is transferred to the data register 20 in parallel by the transfer gate 22 as shown in FIG. 3B by an arrow R. Then, the transferred data is shifted as shown in FIG. 3C, so that a serial data is supplied in the order of the first data bit $B_F$ to $B_L$ from an output of the data register 20 to a following stage.

Figure 3C:
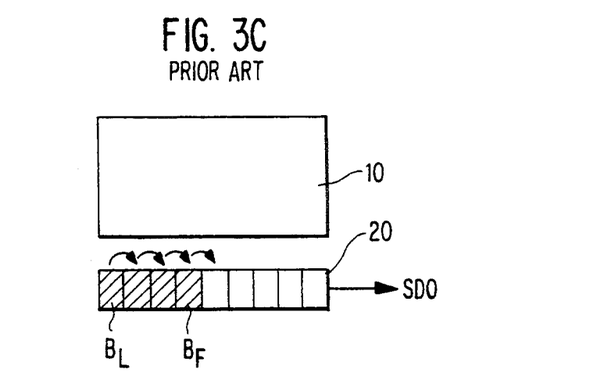

According to the second conventional memory apparatus, however, there is a disadvantage in that an invalid data of five bits is included in the output serial data SDO, because the input serial data SDI is of four bits, while the data register 20 is of nine bits, as shown in FIGS. 3A to 3C.

Figure 4:
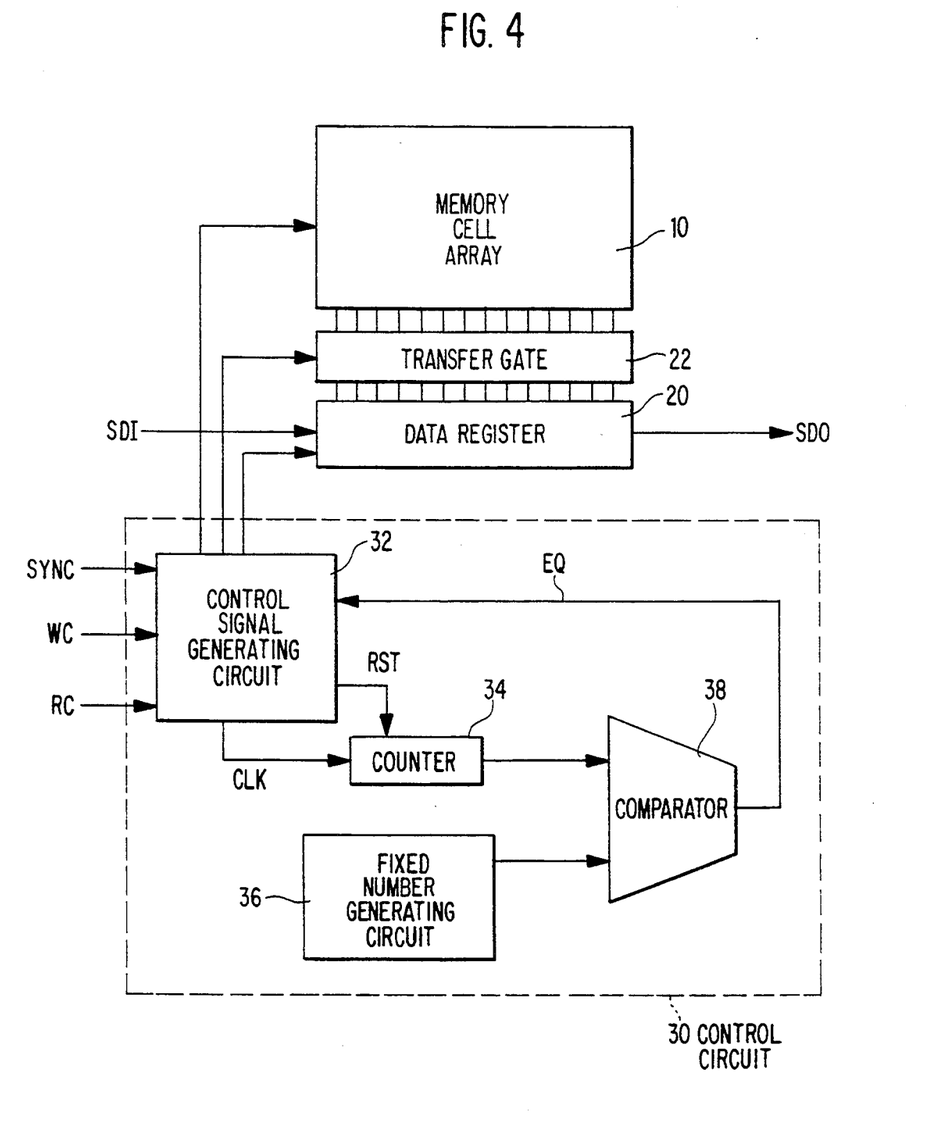
FIG. 4 is a block diagram showing a memory apparatus of a first preferred embodiment according to the invention.
Figure 5:
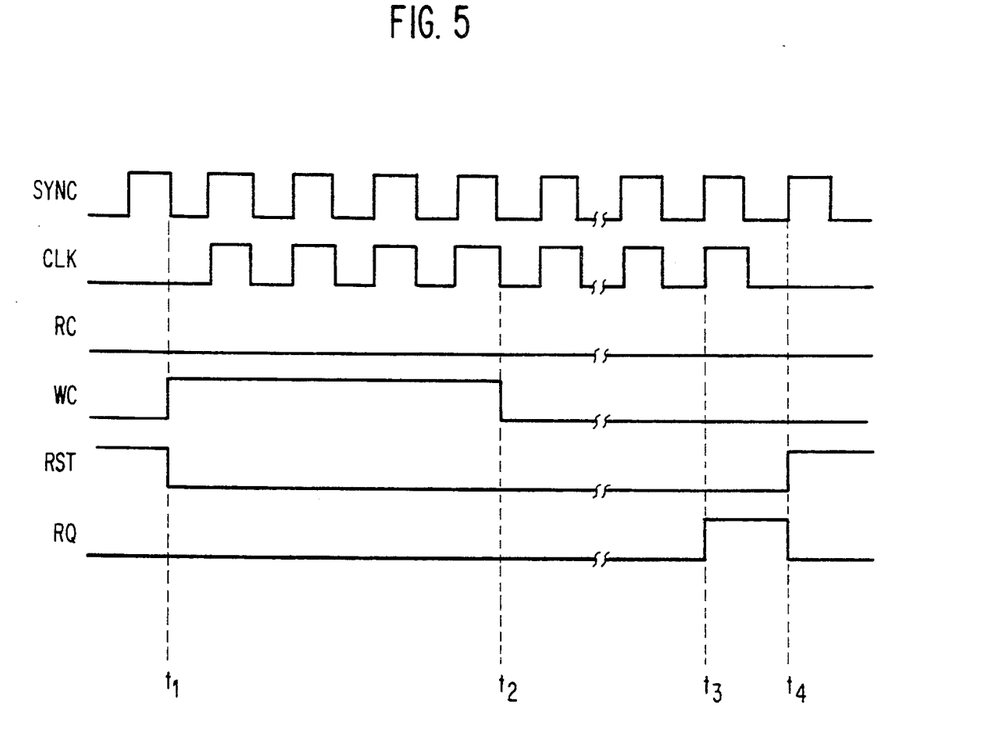
FIG. 5 is a timing chart showing operation of the first preferred embodiment.

Next, a memory apparatus of a first preferred embodiment according to the invention will be explained in conjunction with FIG. 4. The memory apparatus includes a memory cell array 10 for storing a data, a data register 20 which is a shift register, a transfer gate 22 connected between the memory cell array 10 and the data register 20, and a control circuit 30 for controlling the memory cell array 10, the data register 20 and the transfer gate 22, respectively.

The control circuit 30 includes a control signal generating circuit 32, a counter 34 controlled to be supplied with a clock signal CLK and a reset signal RST by the control signal generating circuit 32, a fixed number generating circuit 36 which generates a number data corresponding to the number of flip-flops (not shown) composing the data register 20, and a comparator 38 connected at inputs to the counter 34 and the fixed number generating circuit 36 and at an output to the control signal generating circuit 32. The comparator 38 compares two signals supplied from the counter 34 and the fixed number generating circuit 36, and supplies an equal signal EQ when the counter output becomes equal to the fixed number. The control signal generating circuit 32 is supplied with a synchronous signal SYNC, a writing signal WC and a reading signal RC.

Figure 6A:
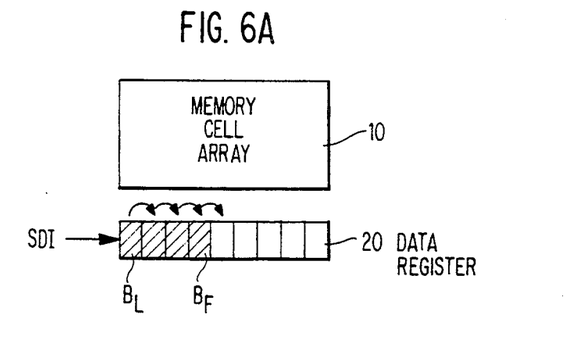
FIGS. 6A to 6D are diagrams explaining operation of the first preferred embodiment.
Figure 6B:
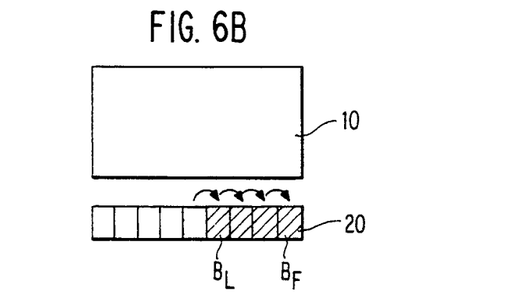
Figure 6C:
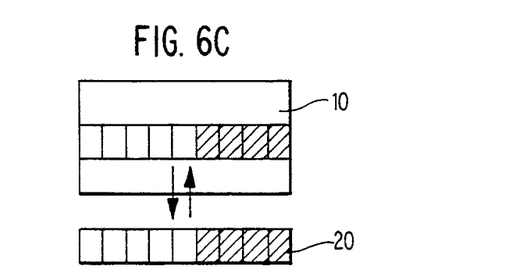

Next, operation of the first preferred embodiment will be explained in conjunction with FIGS. 5 and 6A to 6D. At first, when the writing control signal WC supplied to the control signal generating circuit 32 becomes high at the time $t_1$, and the reset signal RST becomes low at the same time, so that the clock signal CLK supplied from the control signal generating circuit 32 to the counter 34 is counted. Then, the input serial data SDI is supplied to the data register 20 in the order of a first bit $B_F$ to a last bit $B_L$ until the writing control signal WC becomes low at the time $t_2$, as shown in FIG. 6A, and the serial data is shifted in the data register. After that, when the first bit $B_F$ reaches to the end step of the data register 20 as shown in FIG. 6B, that is, when the number of the clock pulse CLK is counted to be nine which is equal to the number determined in the fixed number generating circuit 36 at a time $t_3$, the equal signal EQ is generated in the comparator 38 to be supplied to the control signal generating circuit 32. At this time, the serial data is stopped shifting, and the serial data is transferred to the memory cell array 10 in parallel by the transfer gate 22 as shown in FIG. 6C. Then, the counter 34 is reset to be zero at the time $t_4$ by the reset signal RST of a high level.

Figure 6D:
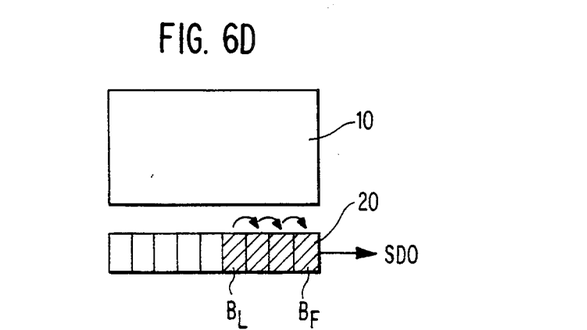

On the other hand, when the reading control signal RC is supplied to the control signal generating circuit 32, the stored data is transferred from the memory cell array 10 to the data register 20 in parallel by the transfer gate 22 as shown in FIG. 6D. Then, the serial data is supplied from the data register 20 bit by bit in the order of the first bit $B_F$ to the last bit $B_L$ to the following stage.

As described above, according to the first preferred embodiment, although the number of bits composing a serial data is smaller than that of flip-flops (not shown) composing the data register 20, an effective data bit is supplied instantly at the beginning time when the serial data is read out, because the serial data is written into the memory cell array 10 under a state such that the first bit $B_F$ reaches to the end step of the data register 20.

Figure 7:
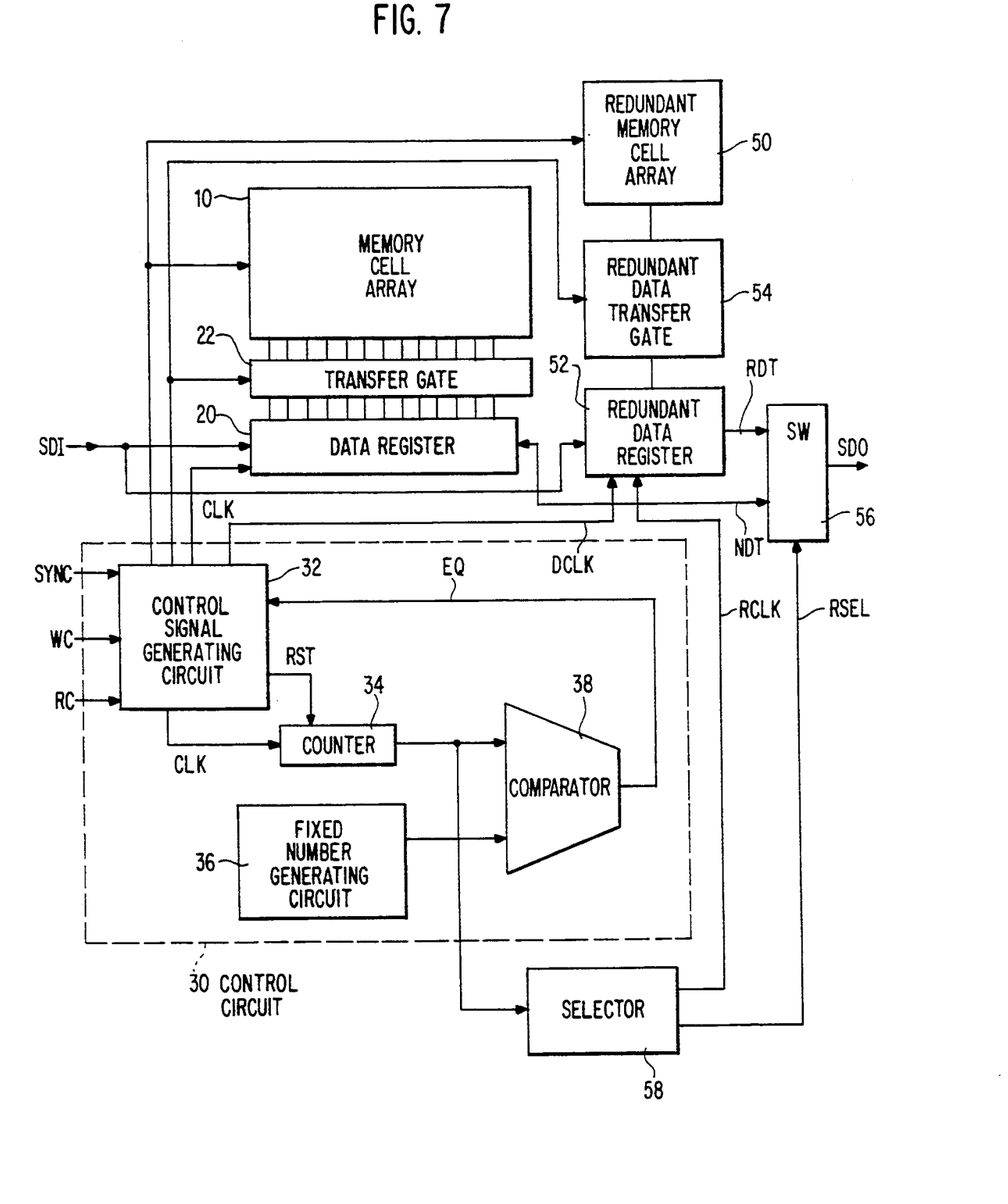
FIG. 7 is a block diagram showing a memory apparatus of a second preferred embodiment according to the invention.

Next, a memory apparatus of a second preferred embodiment according to the invention will be explained in conjunction with FIG. 7, except for the same components as the first preferred embodiment shown in FIG. 4. A memory apparatus according to the second preferred embodiment further includes a redundant memory cell array 50 for storing a redundant data, a redundant data register 52, a redundant data transfer gate 54 connected between the redundant memory cell array 50 and the redundant data register, a switching circuit 56 connected at inputs to outputs of the data register 20 and the redundant data register 52, and a selector 58 connected at an input to an output of the counter 34 and at an output to the switching circuit 56. The redundant memory cell array 50 stores a data corresponding to a disabled memory cell of the memory cell array 10. The redundant data register 52 is supplied with an input serial data SDI to be stored by a clock signal DCLK, when a signal RCLK becomes high, and supplies a redundant data RDT to the switching circuit 56. The selector 58 compares the number of clock pulses CLK counted by the counter 34 and a predetermined number corresponding to the disabled memory cell of the memory cell array 10, and supplies signals RCLK and RSEL when the number of the clock pulses CLK becomes to the number determined in the selector 58. The switching circuit 56 supplies an output serial data SDO by selecting one of the redundant data RDT and a normal data NDT supplied from the data register 20 in accordance with the signal RSEL from the selector 58.

Figure 8A:
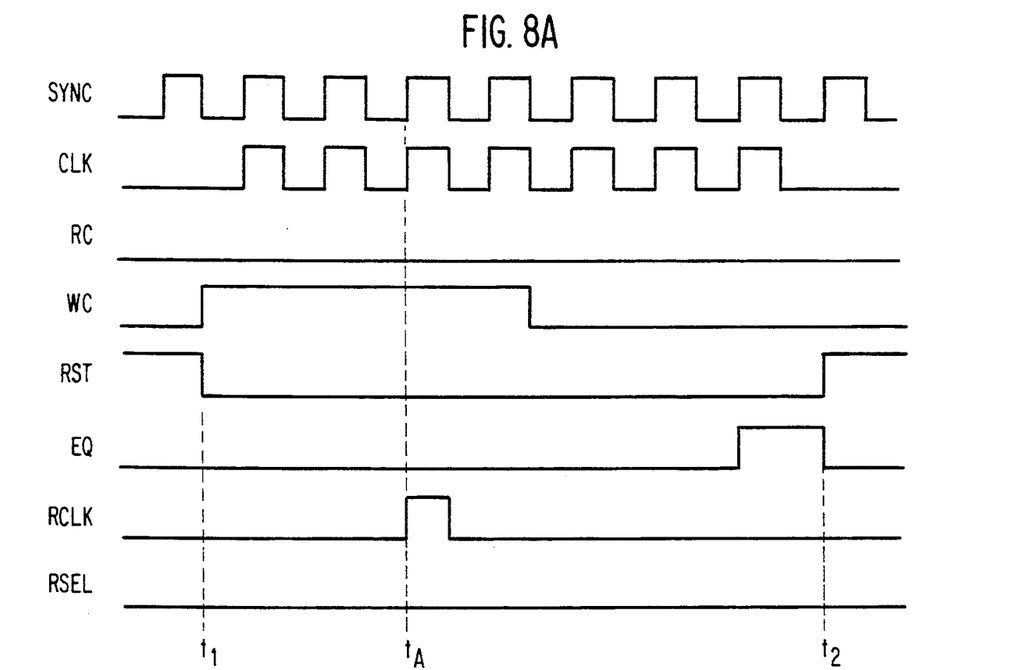
FIGS. 8A and 8B are timing charts showing operation of the second preferred embodiment.
Figure 8B:
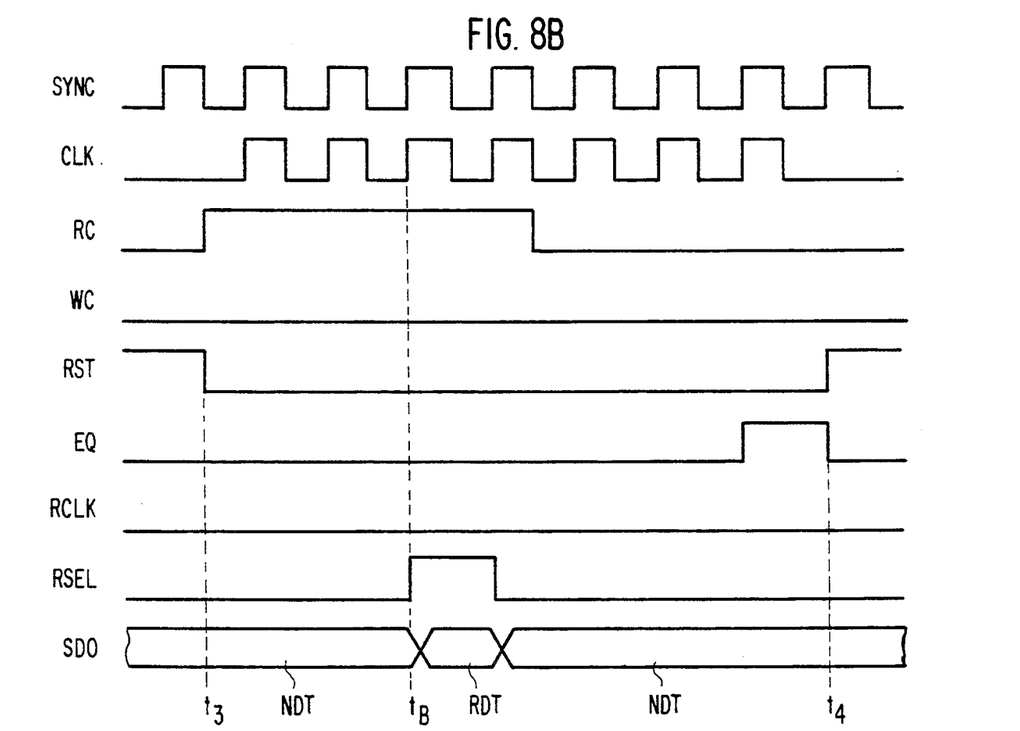

Next, operation of the second preferred embodiment will be explained in conjunction with FIGS. 8A and 8B. At first, when the writing control signal WC supplied to the control signal generating circuit 32 becomes high (time $t_1$), and a serial data is supplied to the data register 20 to be stored in the memory cell array 10 in the same manner as the first preferred embodiment. In this state, when the number of the clock signals CLK becomes equal to the number stored in the selector 58, the signal RCLK of high level is supplied to the redundant data register 52 at a time $t_A$. Then, the redundant data register 52 is activated, and a data corresponding to the disabled memory cell is stored in the redundant data register 52. After that, the redundant data is transferred to the redundant memory cell array 50 by the redundant transfer gate 54. The serial data excluding the redundant data is stored into the memory cell array 10 at a time $t_2$.

On the other hand, when the reading control signal RC supplied to the control signal generating circuit 32 becomes high at a time $t_3$, the data stored in the normal memory cells of the memory cell array 10 are transferred to the data register 20 by the transfer gate 22. At the same time, a redundant data stored in the redundant memory cell array 50 is transferred to the redundant data register 52 by the redundant data transfer gate 54. After that, the normal data NDT is supplied to the switching circuit 56 to be transmitted therethrough as the output serial data SDO, when the signal RSEL is low to be supplied to the switching circuit 56 (times $t_3$ to $t_B$). On the other hand, when the number of the clock pulses CLK becomes equal to the number stored in the selector 58, the signal RSEL becomes high to be supplied to the switching circuit 56 at the time $t_B$. Then, the redundant data RDT is transferred from the redundant data register 52 to the switching circuit 56 and is supplied therefrom as the serial data output SDO instead of the normal data NDT to a following stage. When the signal RSEL becomes low again, the data is supplied from the data register 20 through the switching circuit 56 to the following stage. Then, the whole bits of the serial data SDO are obtained at the output of the switching circuit 56 at a time $t_4$.

As described above, according to the second preferred embodiment, even if there is a disabled memory cell in the memory cell array 10, the memory apparatus operates normally.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A memory apparatus comprising:
    a memory cell array for storing a data of bits;
    a shift register for receiving an input serial data to be stored in said memory cell array and supplying an output serial data to be read from said memory cell array;
    a transfer gate which is positioned between said memory cell array and said shift register to transfer said data of bits in parallel therebetween; and
    a control circuit for controlling said shift register to shift said input serial data;
    wherein said control circuit controls said shift register to shift said input serial data until a first bit thereof reaches to a final step of said shift register, and then controls said transfer gate to transfer said input serial data in parallel to be stored in said memory cell array.

2. A memory apparatus, according to claim 1, wherein:
    said control circuit comprises:
    a counter for counting clock signals;
    a control signal generating circuit for generating control signals to be supplied to said memory array, said shift register, said transfer gate, and said counter; and
    a comparator for comparing the number of total steps of said shift register and a counted value of said counter to supply an equal signal to be supplied to said control signal generating circuit, when said counted value becomes equal to said number of total steps, said counter starting a count of said clock signals, when said first bit of said input serial data is stored in a first step of said shift register.

3. A memory apparatus, according to claim 1 or 2, further comprising:
    a redundant memory for storing a data corresponding to a disabled memory cell of said memory cell array; and
    a switch circuit for selecting one of output signals from said shift register and said redundant memory.

4. A memory apparatus, according to claim 3, further comprising:
    a selector for storing a data corresponding to said disabled memory cell of said memory cell array, comparing said counted value of said counter with said data corresponding to said disabled memory cell, and supplying a signal to said switching circuit to select an output signal from said redundant memory, when said counted value becomes equal to said data corresponding to said disabled memory cell.

* * * * *